(12) United States Patent
Park et al.

(10) Patent No.: US 8,741,164 B2
(45) Date of Patent: Jun. 3, 2014

(54) METHODS FOR OPTIMIZING A PLASMA PROCESS

(75) Inventors: Sangwuk Park, Gyeonggi-do (KR); Kye Hyun Baek, Gyeonggi-do (KR); Kyoungsub Shin, Gyeonggo-do (KR); Brad H. Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 13/599,155

(22) Filed: Aug. 30, 2012

(65) Prior Publication Data

US 2013/0052757 A1 Feb. 28, 2013

(30) Foreign Application Priority Data

Aug. 31, 2011 (KR) ........................ 10-2011-0088026

(51) Int. Cl.
  *G01L 21/30* (2006.01)
  *G01R 31/00* (2006.01)

(52) U.S. Cl.
  USPC ....................................... 216/60; 156/345.24

(58) Field of Classification Search
  USPC ....................................... 216/60; 156/345.24
  See application file for complete search history.

(56) References Cited

U.S. PATENT DOCUMENTS

| 7,402,257 B1 * | 7/2008 | Sonderman et al. ............ 216/60 |
| 2004/0200718 A1 | 10/2004 | Oh et al. |
| 2009/0029489 A1 | 1/2009 | Park et al. |
| 2011/0215072 A1 | 9/2011 | Park et al. |
| 2012/0041584 A1 | 2/2012 | Park et al. |

FOREIGN PATENT DOCUMENTS

| EP | 1 976 347 A2 | 10/2008 |
| JP | 2004-186539 | 7/2004 |
| JP | 2008-251462 | 10/2008 |
| KR | 1020070048832 A | 5/2007 |
| KR | 1020090010608 A | 1/2009 |
| KR | 1020110101483 A | 9/2011 |

* cited by examiner

*Primary Examiner* — Roberts Culbert
(74) *Attorney, Agent, or Firm* — Myers Bigel Sibley & Sajovec, PA (57) ABSTRACT

Methods for optimizing a plasma process are provided. The method may include obtaining a measurement spectrum from a plasma reaction in a chamber, calculating a normalized measurement standard and a normalized measurement spectrum of the measurement spectrum, comparing the normalized measurement spectrum with a normalized reference spectrum, and comparing the normalized measurement standard with a normalized reference standard to determine whether to change a process parameter of the plasma process or clean the chamber when the normalized measurement spectrum and the normalized reference spectrum are mismatched.

18 Claims, 7 Drawing Sheets

METHODS FOR OPTIMIZING A PLASMA PROCESS

CROSS-REFERENCE TO RELATED APPLICATIONS

This U.S. non-provisional patent application claims priority under 35 U.S.C. §119 to Korean Patent Application No. 10-2011-0088026, filed on Aug. 31, 2011, the entire contents of which is incorporated by reference herein.

BACKGROUND

The inventive concept relates to methods of manufacturing a semiconductor device and, more particularly, to methods for performing plasma processes that may be used in the manufacture of semiconductor devices.

Semiconductor devices are typically manufactured by a plurality of processes such as deposition processes and etching processes. The etching processes may be performed in a semiconductor manufacturing apparatus that induces a plasma reaction. The plasma reaction may generate by-products on an inner wall of a processing chamber and may also wear or degrade parts within the chamber. The by-products that are generated on the inner wall of the chamber may be cleaned by periodically performing preventive maintenance on the chamber. However, the plasma reaction may cause problems before the preventive maintenance is performed.

SUMMARY

Embodiments of the inventive concept may provide methods for performing a plasma process in which the plasma reaction is monitored in real time.

Embodiments of the inventive concept may also provide methods for improving or optimizing a plasma process which may increase productivity and/or production yield.

In one aspect, methods for controlling a plasma process are provided which may include: obtaining a measurement spectrum from a plasma reaction in a chamber; obtaining a normalized measurement standard and a normalized measurement spectrum from the measurement spectrum; comparing the normalized measurement spectrum with a normalized reference spectrum; and comparing the normalized measurement standard with a normalized reference standard in response to the normalized measurement spectrum and the normalized reference spectrum being mismatched.

In some embodiments, obtaining the normalized measurement spectrum may include: selecting measurement first valleys of the measurement spectrum; obtaining a measurement first standard using the measurement first valleys; and dividing the measurement spectrum by the measurement first standard for each of a first plurality of wavelength bands to obtain the normalized reference spectrum.

In other embodiments, obtaining the normalized measurement standard may include: selecting measurement second valleys in the measurement first standard; obtaining a measurement second standard using the measurement second valleys; and dividing the measurement first standard by the measurement second standard for each of a second plurality of wavelength bands to obtain the normalized measurement standard.

In still other embodiments, the method may further include: obtaining a reference spectrum of the plasma reaction; and obtaining the normalized reference standard and the normalized reference spectrum and from the reference spectrum.

In yet other embodiments, obtaining the normalized reference spectrum may include: selecting reference first valleys of the reference spectrum; obtaining a reference first standard using the reference first valleys; and dividing the reference spectrum by the reference first standard for each of a first plurality of wavelength bands to obtain the normalized reference spectrum.

In yet still other embodiments, obtaining the normalized reference standard may include: selecting reference second valleys in the reference first standard; obtaining a reference second standard using the reference second valleys; and dividing the reference first standard by the reference second standard for each of a second plurality of wavelength bands to obtain the normalized reference standard.

In further embodiments, if the normalized measurement standard and the normalized reference standard are substantially matched with each other, at least one process parameter may be changed.

In still further embodiments, if the normalized measurement standard and the normalized reference standard are not substantially matched, the chamber may be cleaned. In this case, the method may further include performing a seasoning process on the chamber.

In even further embodiments, when the normalized measurement spectrum and the normalized reference spectrum are substantially matched with each other, the method may further include verifying whether a monitoring of the plasma reaction is completed.

In another aspect, a method for controlling a plasma process may include: obtaining a measurement spectrum from a plasma reaction in a chamber; calculating a measurement first standard that connects measurement first valleys of the measurement spectrum; dividing the measurement spectrum by the measurement first standard to obtain a normalized measurement spectrum; calculating a measurement second standard that connects measurement second valleys in the measurement first standard; dividing the measurement first standard by the measurement second standard to obtain a normalized measurement standard; comparing the normalized measurement spectrum with a normalized reference spectrum; and comparing the normalized measurement standard with a normalized reference standard to determine whether to change a process parameter of the plasma process or clean the chamber when the normalized measurement spectrum and the normalized reference spectrum are mismatched.

In yet another aspect, methods of performing semiconductor processing are provided in which a production line is provided that includes a plurality of chambers. Plasma processing is performed in each of the plurality of chambers on the production line. The respective spectrums of the plasma processing that is performed in each of the plurality of chambers are monitored in real time. A plurality of control regulation units are used to individually control the process parameters of the plasma processing for each of the plurality of chambers while inducing substantially the same plasma reaction in each of the plurality of chambers.

BRIEF DESCRIPTION OF THE DRAWINGS

The inventive concept will become more apparent in view of the attached drawings and accompanying detailed description.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and to let those skilled in the art know the category of the inventive concept. Embodiments of the inventive concept are not limited to the specific examples provided herein. Portions of the drawings may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. The same reference numerals or the same reference designators denote the same elements throughout the specification.

Figure 1:
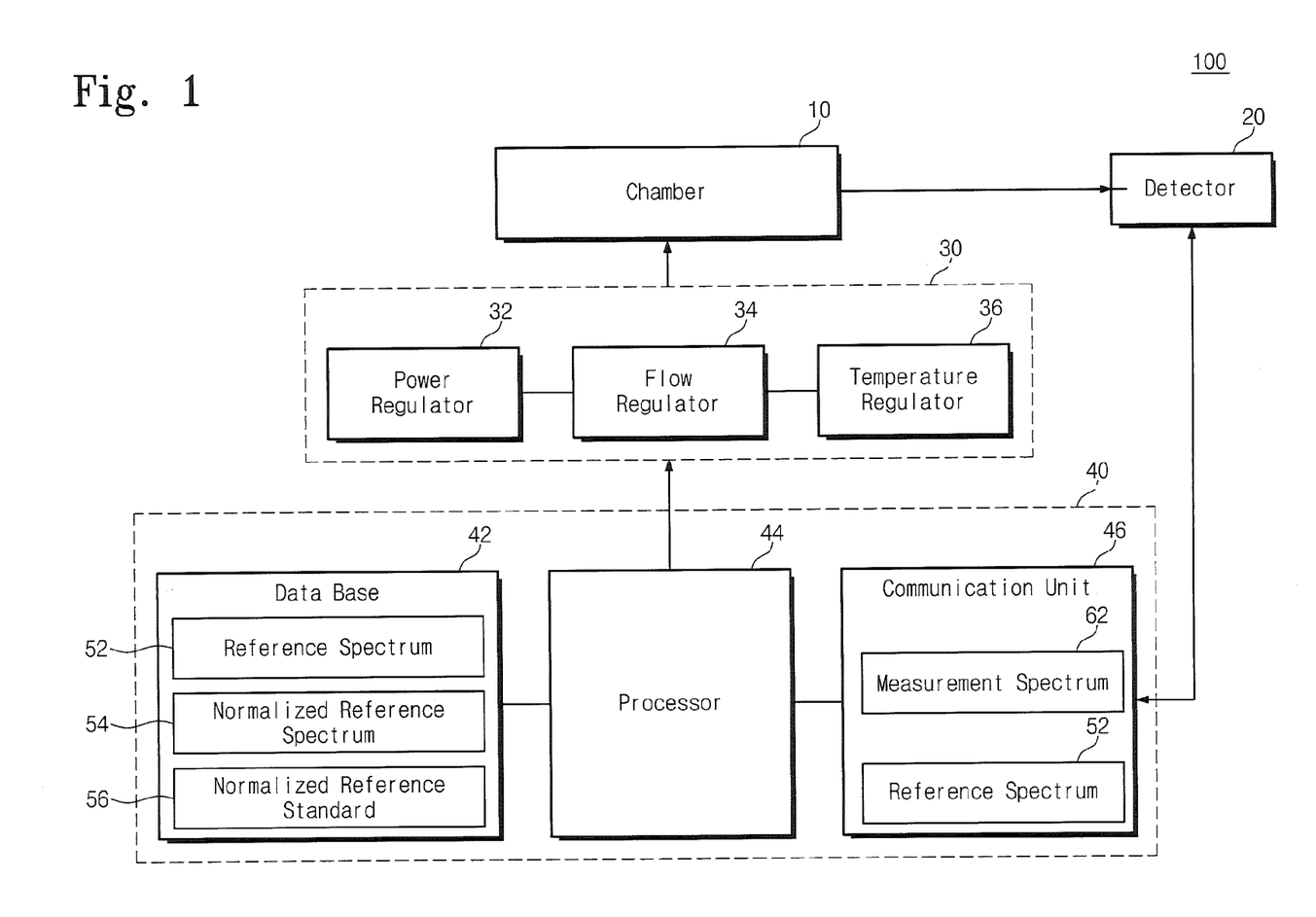
FIG. 1 is a schematic block diagram of view a semiconductor manufacturing apparatus according to embodiments of the inventive concept.
Figure 2:
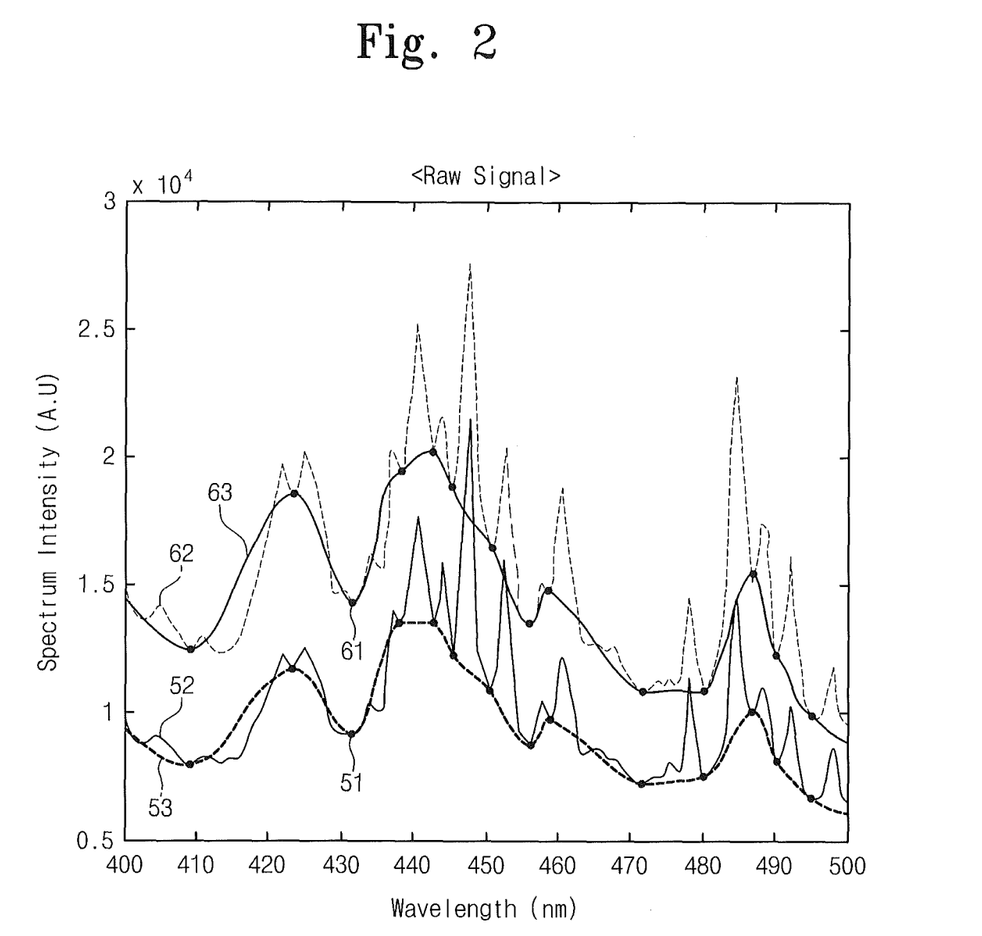
FIG. 2 is a graph illustrating a reference spectrum and a measurement spectrum that is detected by a detector.
Figure 3:
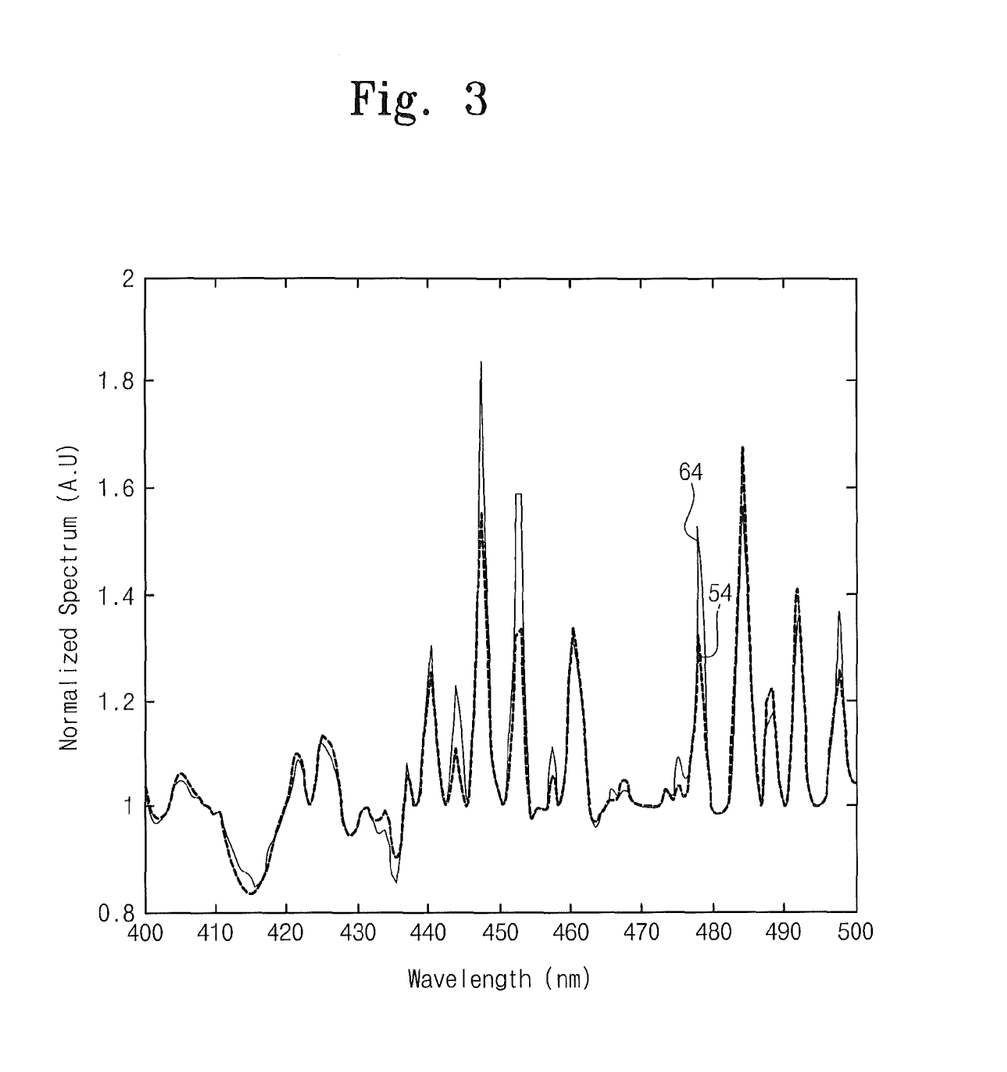
FIG. 3 is a graph illustrating a normalized reference spectrum and a normalized measurement spectrum that may be obtained from the spectrums of FIG. 2.
Figure 4:
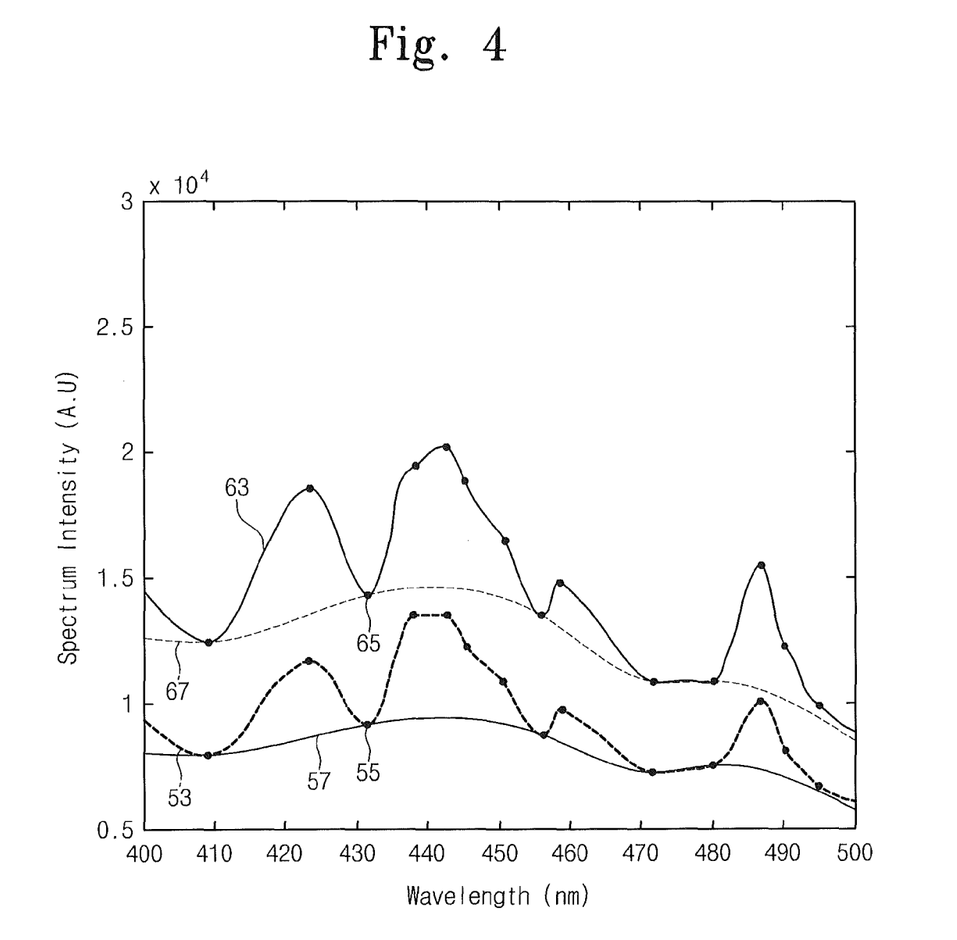
FIG. 4 is a graph illustrating a reference first standard and a measuring first standard that may be obtained from the spectrums of FIG. 2.

FIG. 1 is a schematic view a semiconductor manufacturing apparatus according to embodiments of the inventive concept. FIG. 2 is a graph illustrating a reference spectrum and a measurement spectrum that may be detected by the detector of FIG. 1. FIG. 3 is a graph illustrating a normalized reference spectrum and a normalized measurement spectrum that may be obtained from the spectrums of FIG. 2. FIG. 4 is a graph illustrating a reference first standard and a measuring first standard that may be obtained from the spectrums of FIG. 2.

Referring to FIGS. 1 to 5, according to embodiments of the inventive concept, a semiconductor manufacturing apparatus 100 may include a control unit 40. The control unit 40 may monitor a measurement spectrum 62 that is detected from a plasma reaction in a chamber 10 by a detector 20, and may output a control signal that is input to a control regulation unit 30. The control unit 40 may remove noise from the measurement spectrum 62 to calculate a normalized measurement spectrum 64. Herein, a "normalized" spectrum refers to a spectrum which has been processed to remove at least some of the noise therefrom. The control unit 40 may also compare the normalized measurement spectrum 64 with a normalized reference spectrum 54 to evaluate a corresponding plasma reaction. If the plasma reaction is abnormal, the control unit 40 may compare a normalized measurement standard 66 with a normalized reference standard 56 to determine what action should be taken in response to the determination that the plasma reaction is abnormal. Herein, a "normalized" standard refers to a standard which has been processed to remove at least some of the noise therefrom. Since the semiconductor manufacturing process according to embodiments of the inventive concept monitors the plasma reaction in real time, it is possible to increase or maximize productivity and production yield.

The semiconductor manufacturing apparatus 100 includes a chamber 10. The chamber 10 may include an etch chamber or a deposition chamber in which a semiconductor manufacturing process such as an etch process and/or a deposition process is performed using a plasma reaction. For example, the etch process may be a process for patterning at least one of a wafer, a silicon layer, an oxide layer, a nitride layer, or a metal layer on the wafer, and may be performed in the etch chamber. The etch chamber may be connected to a transfer chamber and a load lock chamber. Even though not shown in the drawings, a shower head, a chuck, and/a cathode may be disposed in the chamber 10. The shower head may inject reaction gases, the chuck may face the shower head to support a wafer, and the cathode may be applied with a high-frequency power exciting the reaction gases and/or an inert gas into a plasma state.

The detector 20 may include a sensor that, for example, optically or electrically senses the plasma reaction. The detector 20 may include, for example, at least one of an optical emission spectroscope (OES), a self-excited electron resonance spectroscope (SEERS), and a voltage-current prober (V-I prober). The OES may obtain the measurement spectrum 62 and a reference spectrum 52 of the plasma reaction. The OES may be used, for example, at an endpoint detection of the etching of a thin layer. The OES may be combined with a view port (not shown) of the chamber 10. The detector 20 may be a device that detects an optical spectrum of the plasma reaction. The detector 20 may generate a spectrum data from the plasma reaction. Hereinafter, the detection and the obtainment of the spectrum by the detector 20 and the control unit 40 may correspond to generation, transmittance and treatment of the spectrum data.

The control regulation unit 30 may control, for example, the high-frequency power, the reaction gas(es), and/or a temperature, each of which may directly influence the plasma reaction. The control regulation unit 30 may include a power regulator 32, a flow regulator 34, and a temperature regulator 36. The power regulator 32 may include a power generator that generates the high-frequency power and a matching unit that matches an output impedance of the high-frequency power. The flow regulator 34 may control a flow amount of the gas supplied from a reaction gas supply unit (not shown). The temperature regulator 36 may include a refrigerant supply unit that supplies a refrigerant cooling a wafer exposed by the plasma reaction into the chamber 10 and a heater heating an outer wall of the chamber 10.

The control unit 40 may include a data base 42, a processor 44, and a communication unit 46. The data base 42 may store data including, for example, the reference spectrum 52. The communication unit 46 may receive data relative to the measurement spectrum 62 from the detector 20 and may output the control signal of the control unit 40. The processor 44 may calculate, compare, or judge the data of the reference spectrum 52 and the measurement spectrum 62. The control unit 40 may process the data of the spectrums. However, for the purpose of clearness in explanation, the expression that the control unit 40 processes the data of the spectrums will be described as an expression that the control unit 40 processes the spectrums.

Until now, the semiconductor manufacturing apparatus 100 according to embodiments was described with reference to FIG. 1. However, the apparatus 100 is not limited to the structure described above. The apparatus 100 may be implemented in various forms.

Methods of optimizing a plasma process in the semiconductor manufacturing apparatus described above will be described with reference to embodiments of the inventive concept.

Figure 6:
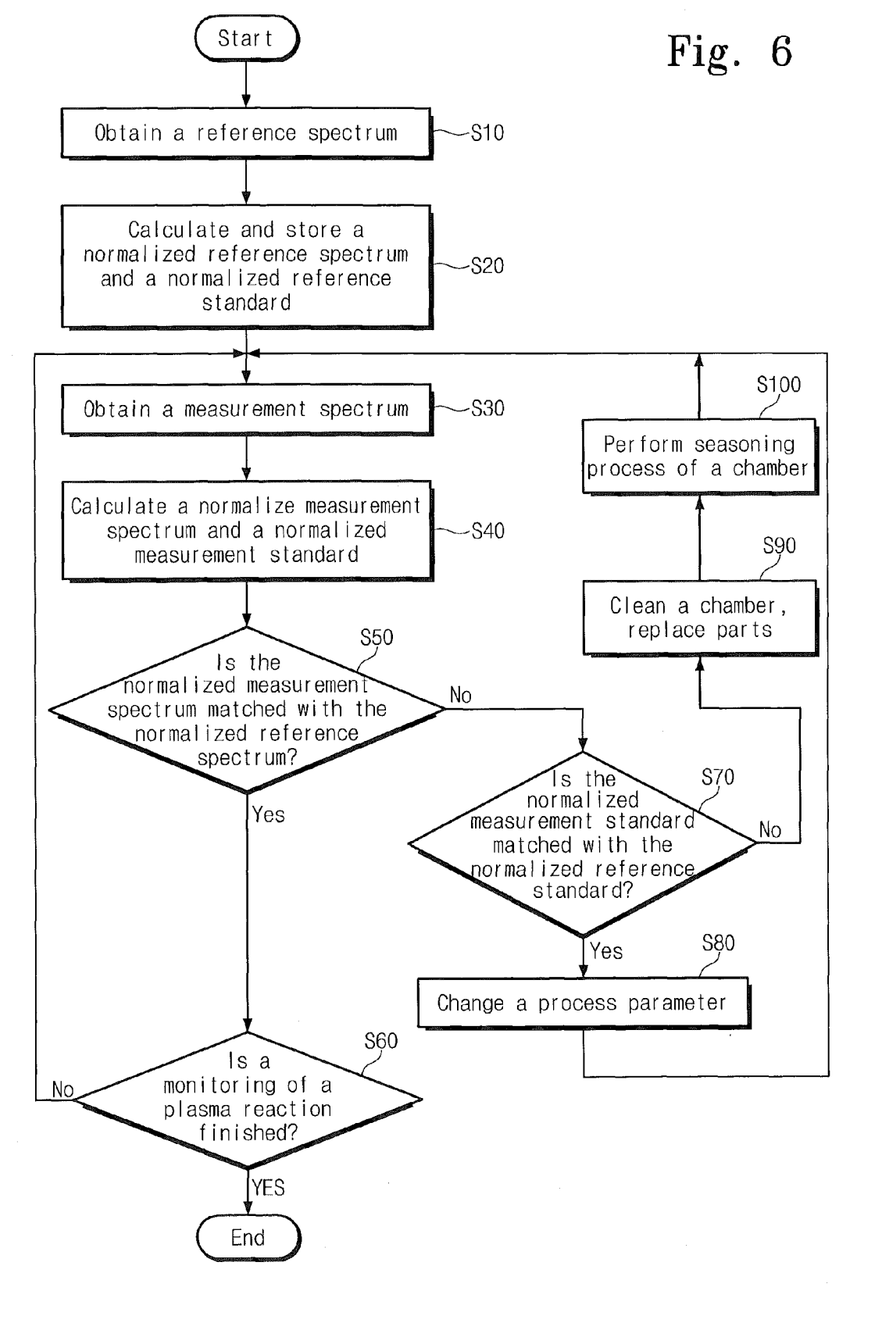
FIG. 6 is a flowchart illustrating a method for optimizing a plasma process according to embodiments of the inventive concept.

FIG. 6 is a flowchart illustrating a method for optimizing a plasma process according to embodiments of the inventive concept.

Referring to FIGS. 1 to 6, the detector 20 may detect the reference spectrum 52 from the plasma reaction in the chamber 10 during a process in which a good semiconductor wafer is manufactured. The reference spectrum 52 may be detected by the detector 20 during the manufacture of the good wafer. The control unit 40 may obtain the reference spectrum 52 detected by the detector 20 through the communication unit 46 according to an input signal from, for example, a host or a worker. The control unit 40 may obtain the reference spectrum 52 from the detector 20 installed at one of a plurality of chambers 10 in which a semiconductor process is performed in which a good wafer was manufactured (S10). The reference spectrum 52 may include noise.

Next, the control unit 40 may remove some or all of the noise from the reference spectrum 52 to calculate a normalized reference spectrum 54 and a normalized reference standard 56 (S20). The control unit 40 may select reference first valleys 51 (see FIG. 2) from the reference spectrum 52. The reference first valleys 51 may, for example, be randomly selected from the entire reference spectrum 52 or may be selected from each of a plurality of major wavelength bands of the reference spectrum 52. The control unit 40 may calculate a reference first standard 53 (see FIG. 2) that connects the reference first valleys 51. In some embodiments, the reference standard 53 may be a curve fit that connects the reference valleys 51, as shown in FIG. 2. The control unit 40 may then divide the reference spectrum 52 by the reference first standard 53 for every one of the wavelength bands to obtain the normalized reference spectrum 54 (see FIG. 3). The normalized reference spectrum 54 may have a plurality of peaks that are equal to or greater than a certain intensity where each peak corresponds to one of the plasma reaction gases. The normalized reference spectrum 54 extends in a direction parallel to an X-axis. Additionally, the control unit 40 may select reference second valleys 55 (see FIG. 4) from the reference first standard 53. The control unit 40 may calculate a reference second standard 57 (see FIG. 4) that connects the reference second valleys 55. The control unit 40 may divide the reference first standard 53 by the reference second standard 57 for every one of the wavelength bands to obtain the normalized reference standard 56 (see FIG. 5). In FIGS. 2 through 5, the X-axis represents a wavelength and the Y-axis represents an intensity of the spectrum or the standard. The control unit 40 may store the normalized reference spectrum 54 and the normalized reference standard 56 in the data base 42.

Next, the detector 20 may detect the measurement spectrum 62 from the plasma reaction in the chamber 10 (S30). The control unit 40 may monitor the plasma reaction in the chamber 10 using the measurement spectrum 62. The measurement spectrum 62 may be detected by the detector 20 in real time or substantially in real time. The control unit 40 may remove noise from the measurement spectrum 62 to calculate the normalized measurement spectrum 64 (see FIG. 3), in the manner discussed below. The detector 20 may periodically detect a new measurement spectrum 62 in response to a control signal from the control unit 40. For example, in some embodiments, the detector 20 may detect one measurement spectrum 62 for each wafer that is treated by a plasma process in the chamber 10. In other exemplary embodiments, the control unit 40 may obtain one measurement spectrum 62 for each plasma process step corresponding to a plurality of wafers.

Figure 5:
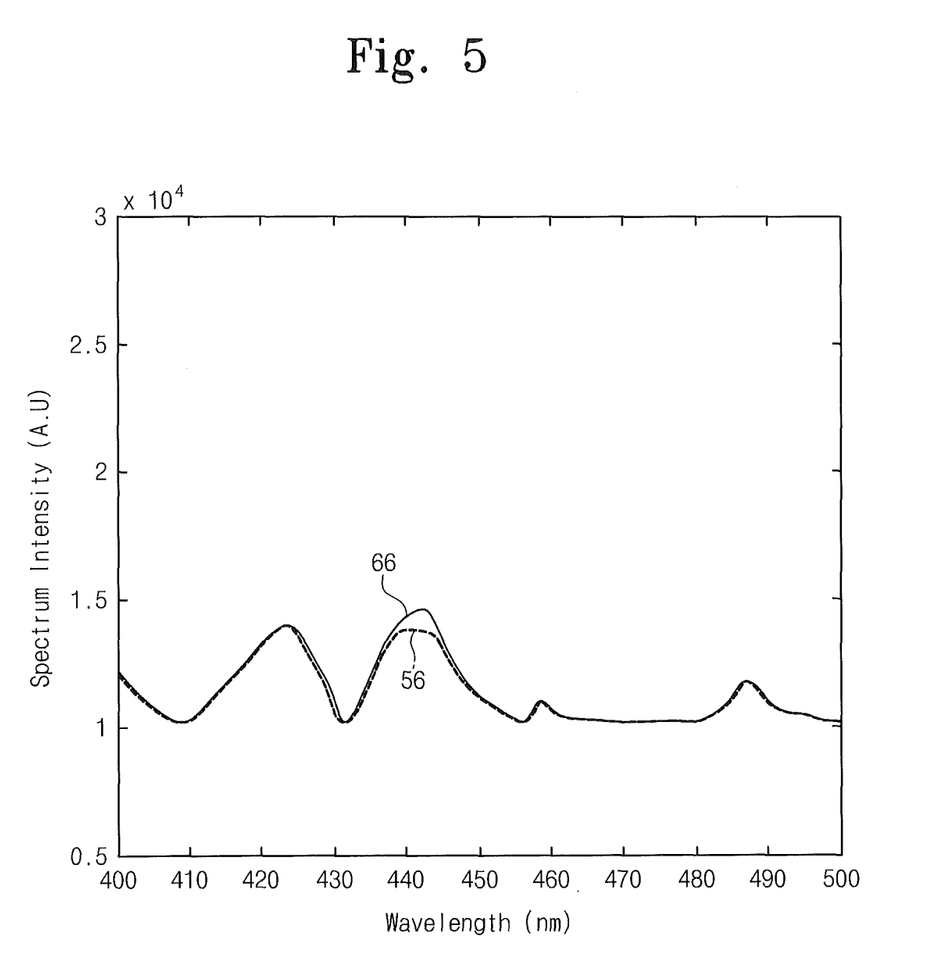
FIG. 5 is a graph illustrating a normalized reference standard and a normalized measuring standard that may be obtained from the standards of FIG. 4.

As noted above, thereafter, the control unit 40 may remove noise from the measurement spectrum 62 to calculate the normalized measurement spectrum 64 and a normalized measurement standard 66 (S40) (see FIGS. 3 and 5). The noise may change the measurement spectrum 62 of the plasma reaction. Consumption of replacement parts of the chamber 10 and by-products formed on the inner wall of the chamber 10 may be the main sources of the noise. The noise may shake measurement first valleys 61 (see FIG. 2) of the measurement spectrum 62 on the X-axis. The control unit 40 may calculate a measurement first standard 63 (see FIG. 2) by connecting the measurement first valleys 61. In some embodiments, the measurement first standard 63 may be a curve fit that connects the measurement first valleys 61, as shown in FIG. 2. The control unit 40 may divide the measurement spectrum 62 by the measurement first standard 63 to calculate the normalized measurement spectrum 64 (see FIG. 3). The control unit 40 may divide the measurement spectrum 62 by the measurement first standard 63 for every one of a plurality of wavelength bands to calculate the normalized measurement spectrum 64. The measurement first standard 63 may include measurement second valleys 65 (see FIG. 4). The control unit 40 may calculate a measurement second standard 67 (see FIG. 4) that connects the measurement second valleys 65. The control unit 40 may divide the measurement first standard 63 by the measurement second standard 67 for every one of the plurality of the wavelength bands to calculate a normalized measurement standard 66 (see FIG. 5).

Next, the control unit 40 may compare the normalized measurement spectrum 64 with the normalized reference spectrum 54 provided from the data base 42 to determine whether the plasma reaction is normal or not (S50). The normalized reference spectrum 54 may correspond to the normalized measurement spectrum 64 across the wavelength bands in one-to-one correspondence. If the normalized reference spectrum 54 and the normalized measurement spectrum 64 are substantially matched with each other, the control unit 40 recognizes that the corresponding plasma reaction is in a normal state. When this occurs, the control unit 40 may then determine whether the monitoring of the plasma reaction has been completed. (S60). The control unit 40 may repeatedly monitor the plasma reaction using a certain time as a period in real time. If the monitoring is not yet completed, the control unit 40 may output a control signal to the detector 20 in response to an input value of real time monitoring so that another measurement spectrum 52 is obtained (S30). Those of skill in the art will recognize that a wide variety of techniques may be used to determine if the normalized reference spectrum 54 and the normalized measurement spectrum 64 are substantially matched at block S50 of FIG. 6.

If at block S50 the normalized reference spectrum 54 and the normalized measurement spectrum 64 are mismatched, the control unit 40 recognizes that the plasma reaction is abnormal, and then the control unit 40 may compare the normalized measurement standard 66 with the normalized reference standard 56 (S70). The control unit 40 may determine whether to change process parameters or clean the chamber 10 by the comparison of the normalized reference standard 56 and the normalized measurement standard 66.

In particular, if the normalized reference standard 56 and the normalized measurement standard 66 are substantially matched with each other, the control unit 40 may change one or more process parameters of the plasma reaction (S80). The control unit 40 may reset process parameters of the control regulation unit 30. The control unit 40 may output a control signal controlling the control regulation unit 30 for inducing the plasma reaction to have a spectrum substantially corresponding to the reference spectrum 52. The control unit 40 may control the regulation unit 30 to change the process parameters so that the plasma reaction has a normal state.

Figure 7:
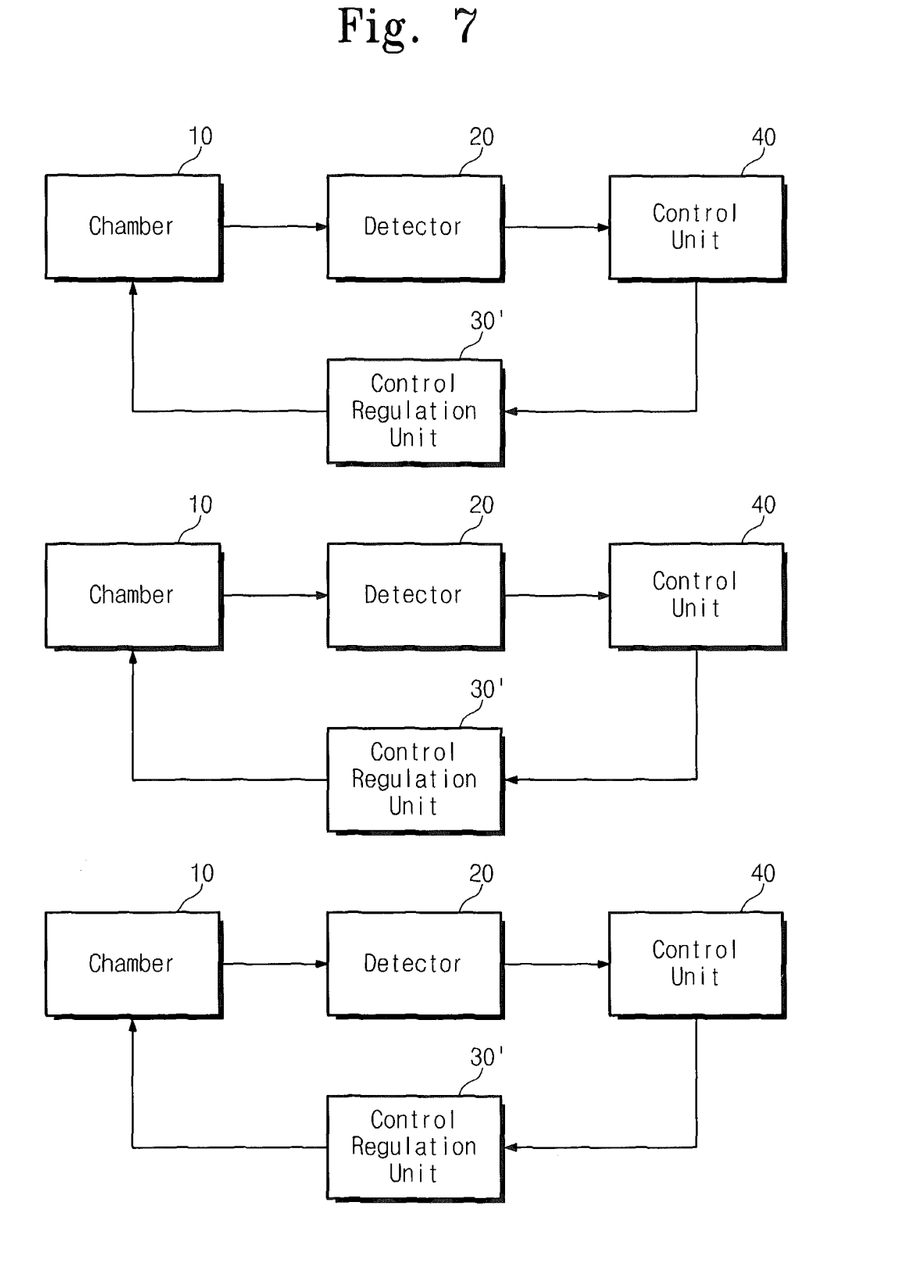
FIG. 7 is a schematic diagram of a production line according to embodiments of the present invention.

As shown in FIG. 7, in some embodiments, a plurality of chambers 10 may be controlled to have process parameters that are different from each other by control of a control regulation unit 30 for the production line. As shown in FIG. 7, the control regulation unit 30 for the production unit may be implemented as a plurality of individual control regulation units 30'. In other embodiments, the control regulation unit 30 for the production line may be implemented as a single unit. The same plasma reaction may be induced in each of the plurality of chambers 10 in the production line. In a conventional method, a plurality of chambers 10 in a production line may be set by one optimal offset consisting of process parameters of the same value. As the condition of the chambers 10 may vary, the plasma reaction that is induced in each of the chambers 10 may vary. However, pursuant to the methods for performing plasma processing according to embodiments of the inventive concept, the plurality of chambers 10 may be set by a plurality of optimal offsets that are different from each other in order to induce substantially the same plasma reaction in each of the chambers 10. Thus, the method for optimizing the plasma process according to embodiments of the inventive concept may increase or maximize production yield.

If the normalized reference standard 56 and the normalized measurement standard 66 are mismatched, the control unit 40 may output a control signal that indicates that the chamber 10 should be cleaned and/or that the replacement of parts within the chamber 10 may be required. The control signal may also or alternatively be implemented as a simple alarm. The chamber 10 may be cleaned by a worker in the production line. Additionally, the worker may check the status of expendable parts in the chamber 10 and may replace the expendable parts as necessary. A polymer, as by-products of the plasma process, that is generated on the inner wall of the chamber may be removed by a wet cleaning. If the polymer is coated to a thickness that is thicker than a predetermined thickness, the polymer may drop in an agglomerate state from the inner wall of the chamber 10 and hence may contaminate a surface of the wafer. Generally, a preventive maintenance (PM) such as a wet cleaning may be periodically performed on the chamber 10. For example, the PM of the chamber 10 may be periodically performed after each cumulative usage time of the chamber 10 of about 100 hours. The control unit 40 may verify an abnormal state of the plasma process to prevent a process accident before the PM is performed. Thus, the method for optimizing the plasma process according to embodiments of the inventive concept may increase or maximize productivity.

After the cleaning of the chamber 10 and/or the replacement of expandable parts has been performed, the control unit 40 may perform a seasoning process on the chamber 10 (S100). The control unit 40 may verify whether to perform the cleaning or replacement parts of the chamber 10 through an electrical switching signal of a door or the parts. The seasoning process may include a preliminary process which places the inside of the chamber 10 under a suitable state capable of performing a semiconductor manufacturing process. A plasma process of a bare wafer may be performed in the chamber 10 during the seasoning process. The control unit 40 may output control signals that control the control regulation unit 30 according to setting values that are input from the data base 42 during the seasoning process. After the seasoning process is finished, the control unit 40 may transmit a control signal for detecting the measurement spectrum 62 in real time to the detector 20 (S30).

According to embodiments of the inventive concept, the plasma reaction may be monitored in real time by the reference spectrum 52 and the measurement spectrum 62 obtained from the detector 20. The control unit 40 may remove noise from the reference spectrum 52 and the measurement spectrum 62 to obtain the normalized reference spectrum 54 and the normalized measurement spectrum 64, and the control unit 40 may compare the normalized measurement spectrum 64 with the normalized reference spectrum 54. Additionally, the control unit 40 may obtain the normalized reference standard 56 and the normalized measurement standard 66 that are calculated from the reference first standard 53 and the measurement first standard 63 that connect valleys obtained from the reference spectrum 52 and the measurement spectrum 62.

If the normalized reference spectrum 54 and the normalized measurement 64 spectrum are mismatched, the control unit 40 may compare the normalized measurement standard 66 with the normalized reference standard 56. If the normalized reference standard 56 and the normalized measurement standard 66 are substantially matched with each other, the control unit 40 may determine the change of the process parameter of the plasma reaction. Alternatively, if the normalized reference standard 56 and the normalized measurement standard 66 are mismatched, the control unit 40 may determine that a cleaning of the chamber 10 or the replacement of parts therein is necessary. As a result, since the method for optimizing the plasma process according to embodiments of the inventive concept can monitor the plasma reaction in real time, it is possible to increase or maximize production yield and productivity.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method for controlling a plasma process, comprising:
obtaining a measurement spectrum from a plasma reaction in a chamber;
obtaining a normalized measurement standard and a normalized measurement spectrum from the measurement spectrum;
comparing the normalized measurement spectrum with a normalized reference spectrum; and
comparing the normalized measurement standard with a normalized reference standard in response to the normalized measurement spectrum and the normalized reference spectrum being mismatched.

2. The method of claim 1, wherein obtaining the normalized measurement spectrum comprises:
selecting measurement first valleys of the measurement spectrum;
obtaining a measurement first standard using the measurement first valleys; and
dividing the measurement spectrum by the measurement first standard for each of a first plurality of wavelength bands to obtain the normalized measurement spectrum.

3. The method of claim 2, wherein obtaining the normalized measurement standard comprises:
selecting measurement second valleys in the measurement first standard;
obtaining a measurement second standard using the measurement second valleys; and
dividing the measurement first standard by the measurement second standard for each of a second plurality of wavelength bands to obtain the normalized measurement standard.

4. The method of claim 1, further comprising:
obtaining a reference spectrum of the plasma reaction; and
obtaining the normalized reference standard and the normalized reference spectrum from the reference spectrum.

5. The method of claim 4, wherein obtaining the normalized reference spectrum comprises:
selecting reference first valleys of the reference spectrum;
obtaining a reference first standard using the reference first valleys; and
dividing the reference spectrum by the reference first standard for each of a first plurality of wavelength bands to obtain the normalized reference spectrum.

6. The method of claim 5, wherein obtaining the normalized reference standard comprises:
selecting reference second valleys in the reference first standard;
obtaining a reference second standard using the reference second valleys; and
dividing the reference first standard by the reference second standard for each of a second plurality of wavelength bands to obtain the normalized reference standard.

7. The method of claim 1, further comprising changing at least one process parameter if the normalized measurement standard and the normalized reference standard are substantially matched with each other.

8. The method of claim 1, further comprising cleaning the chamber if the normalized measurement standard and the normalized reference standard are not substantially matched.

9. The method of claim 8, further comprising performing a seasoning process on the chamber.

10. The method of claim 1, wherein when the normalized measurement spectrum and the normalized reference spectrum are substantially matched with each other, the method further comprises verifying whether a monitoring of the plasma reaction is completed.

11. A method for controlling a plasma process, comprising:
obtaining a measurement spectrum from a plasma reaction in a chamber;
calculating a measurement first standard that connects measurement first valleys of the measurement spectrum;
dividing the measurement spectrum by the measurement first standard to obtain a normalized measurement spectrum;
calculating a measurement second standard that connects measurement second valleys in the measurement first standard;
dividing the measurement first standard by the measurement second standard to obtain a normalized measurement standard;
comparing the normalized measurement spectrum with a normalized reference spectrum; and
comparing the normalized measurement standard with a normalized reference standard to determine whether to change a process parameter of the plasma process or to clean the chamber when the normalized measurement spectrum and the normalized reference spectrum are mismatched.

12. The method of claim 11, further comprising:
obtaining a reference spectrum of the plasma reaction;
obtaining a reference first standard that connects reference first valleys of the reference spectrum;
dividing the reference spectrum by the reference first standard for each of a plurality of wavelength bands to obtain the normalized reference spectrum;
calculating a reference second standard that connects reference second valleys in the reference first standard; and
dividing the reference first standard by the reference second standard for each of a plurality of wavelength bands to obtain the normalized reference standard.

13. The method of claim 11, wherein the process parameter is changed if the normalized measurement standard and the normalized reference standard are substantially matched with each other.

14. The method of claim 11, wherein the chamber is cleaned if the normalized measurement standard and the normalized reference standard are mismatched.

15. The method of claim 14, further comprising:
performing a seasoning process of the chamber.

16. A method of performing semiconductor processing comprising:
providing a production line that includes a plurality of chambers;
performing plasma processing in each of the plurality of chambers on the production line;
monitoring respective spectrums of the plasma processing that is performed in each of the plurality of chambers in real time; and
using a plurality of control regulation units to individually control the process parameters of the plasma processing for each of the plurality of chambers while inducing substantially the same plasma reaction in each of the plurality of chambers,
wherein using the control regulation unit to individually control the process parameters of the plasma processing of each of the plurality of chambers comprises changing at least one of a power setting, a flow setting or a temperature setting for at least some of the plurality of chambers in response to the monitoring of the respective spectrums of the plasma processing wherein the monitoring of the respective spectrums of the plasma processing comprises:

using one or more detectors to obtain the respective spectrums;

normalizing each of the respective spectrums to obtain a plurality of normalized spectrums; and comparing each of the plurality of normalized spectrums to a respective normalized reference spectrum.

17. The method of claim 16, further comprising:

initiating a corrective action if one of the plurality of normalized spectrums does not substantially match its respective normalized reference spectrum.

18. The method of claim 17, further comprising:

obtaining a plurality of normalized measurement standards from the respective spectrums; and comparing each of the plurality of normalized measurement standards to respective ones of a plurality of normalized reference standards.

\* \* \* \* \*